(12) United States Patent
Takahata et al.

(10) Patent No.: US 7,820,547 B2
(45) Date of Patent: Oct. 26, 2010

(54) FLASH MEMORY DEVICE WITH WORD LINES OF UNIFORM WIDTH AND METHOD FOR MANUFACTURING THEREOF

(75) Inventors: Naofumi Takahata, Fukushima-Ken (JP); Masahiko Higashi, Fukushima-Ken (JP); Yukihiro Utsuno, Fukushima-Ken (JP)

(73) Assignee: Spansion LLC, Sunnyvale, CA (US)

( * ) Notice: Subject to any disclaimer, the term of this patent is extended or adjusted under 35 U.S.C. 154(b) by 157 days.

(21) Appl. No.: 12/179,400

(22) Filed: Jul. 24, 2008

(65) Prior Publication Data

US 2009/0184427 A1 Jul. 23, 2009

(30) Foreign Application Priority Data

Jul. 25, 2007 (JP) .............................. 2007-019752

(51) Int. Cl.
*H01L 21/4763* (2006.01)
(52) U.S. Cl. .................................................... 438/637
(58) Field of Classification Search ................. 438/637, 438/262, 263, 287, 288, 234; 365/51, 63
See application file for complete search history.

(56) References Cited

U.S. PATENT DOCUMENTS

| | | | | |
|---|---|---|---|---|
| 5,786,273 | A * | 7/1998 | Hibi et al. ................... | 438/637 |
| 6,403,431 | B1 * | 6/2002 | Chung et al. ................ | 438/296 |
| 6,544,883 | B2 * | 4/2003 | Ohuchi ....................... | 438/624 |
| 6,864,173 | B2 * | 3/2005 | Kim ........................... | 438/675 |
| 2002/0022360 | A1 * | 2/2002 | Kim et al. ................... | 438/637 |
| 2003/0040152 | A1 * | 2/2003 | Liu et al. .................... | 438/239 |

FOREIGN PATENT DOCUMENTS

JP 2007013155 1/2007

* cited by examiner

*Primary Examiner*—David A Zarneke
*Assistant Examiner*—Jenny L Wagner

(57) ABSTRACT

A method for manufacturing a semiconductor device, the method including: forming a bit line in a semiconductor substrate; forming a plurality of word lines which intersect with the bit line at predetermined intervals on the semiconductor substrate; eliminating a portion of the plurality of word lines; forming an interlayer insulating film on the semiconductor substrate; and forming a metal plug which penetrates through the interlayer insulating film and is coupled to the bit line in a region where the portion of the plurality of word lines was eliminated.

7 Claims, 17 Drawing Sheets

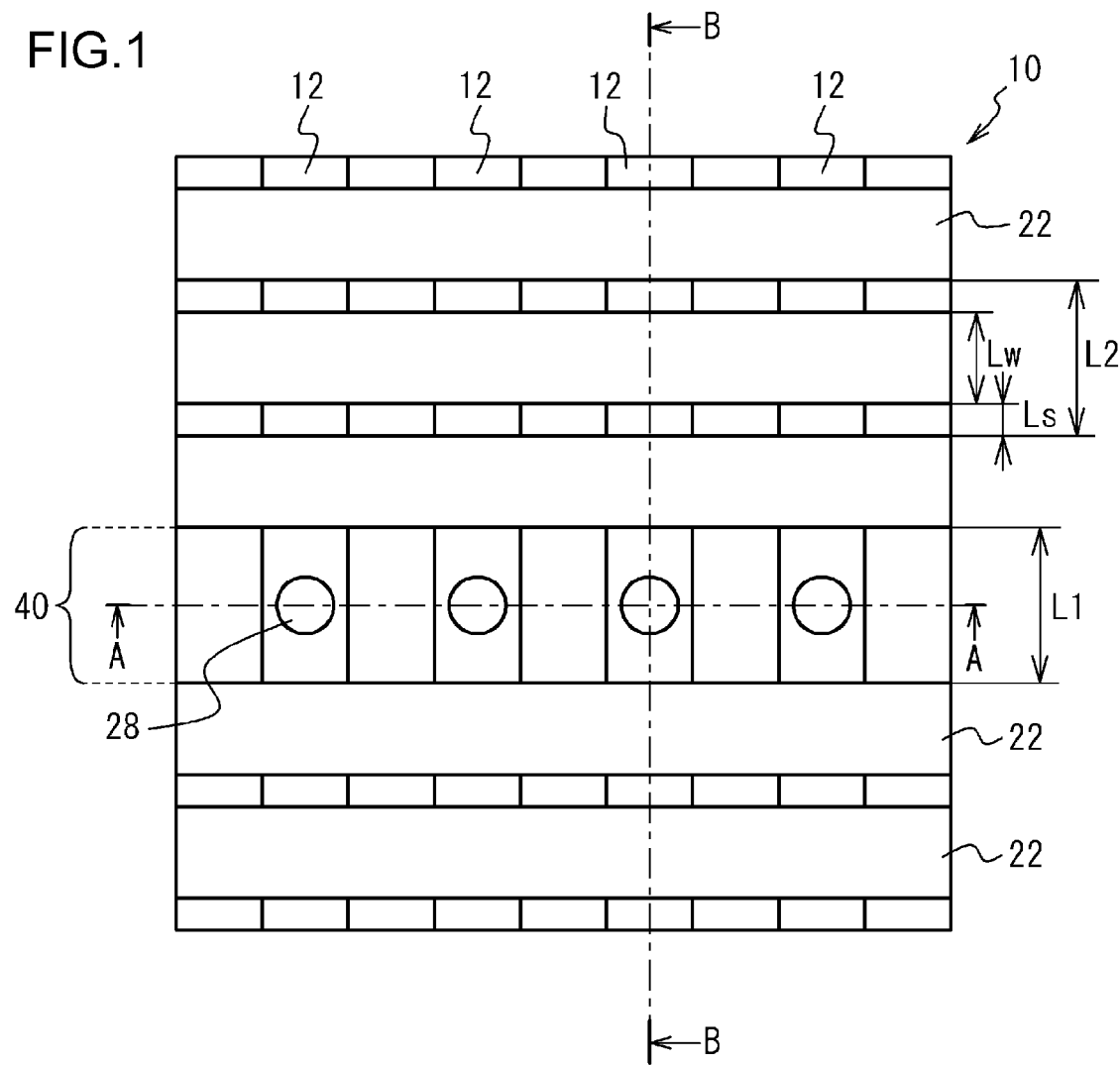

A-A

B-B

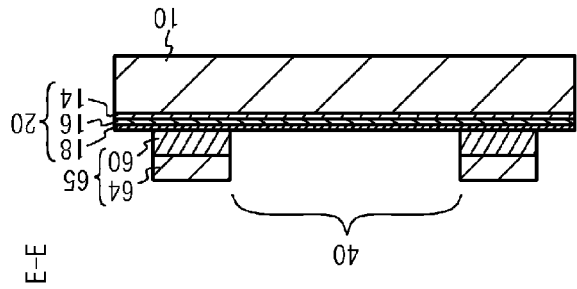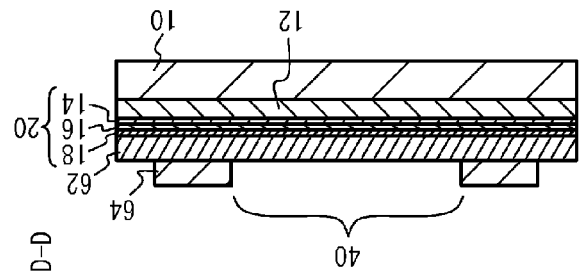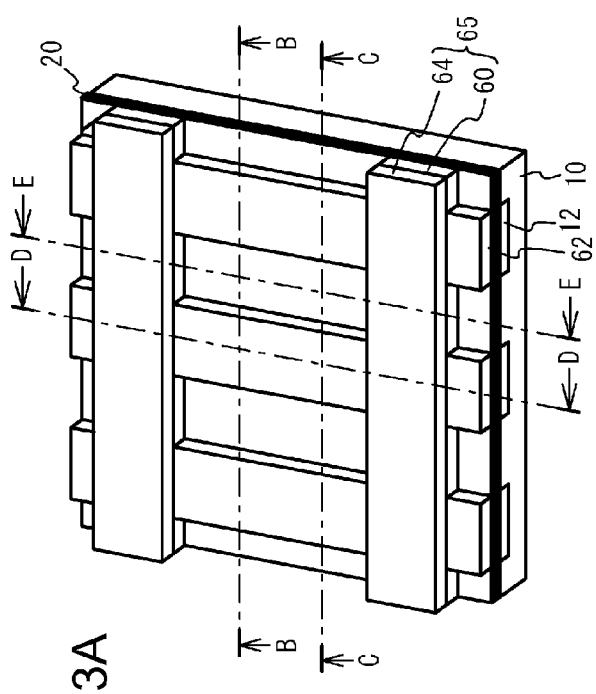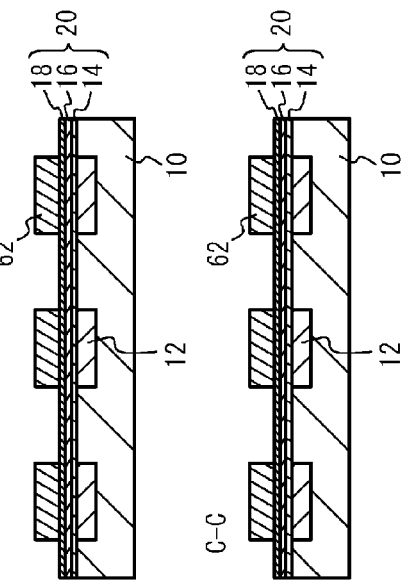

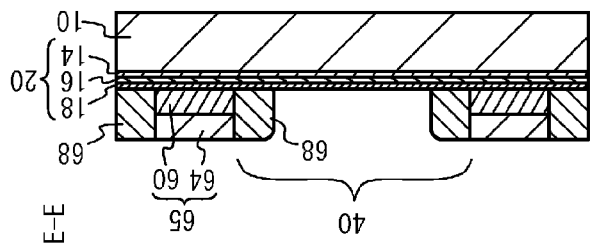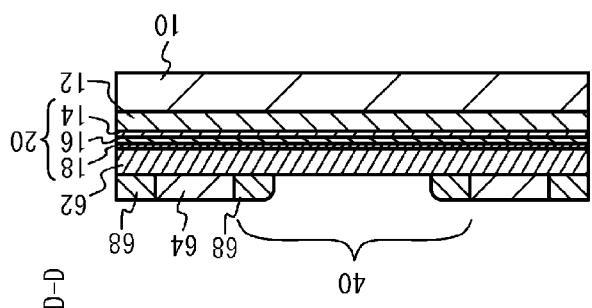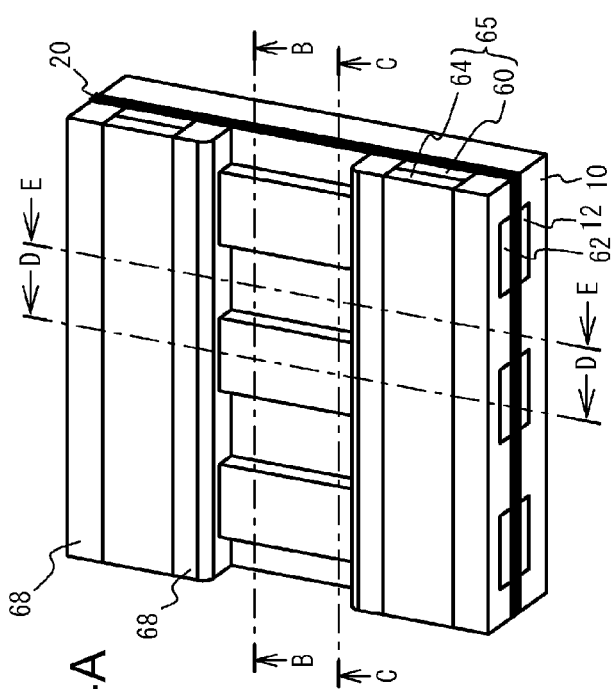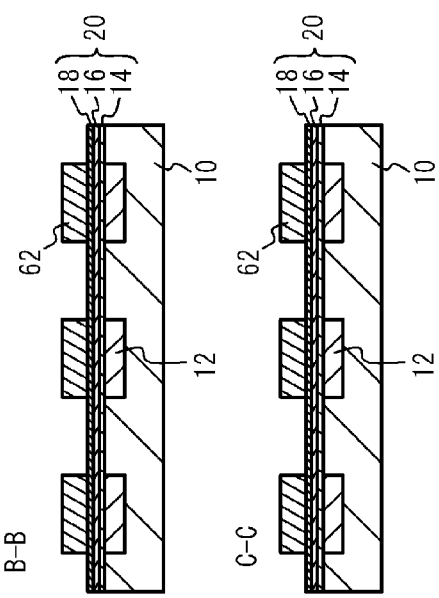

FLASH MEMORY DEVICE WITH WORD LINES OF UNIFORM WIDTH AND METHOD FOR MANUFACTURING THEREOF

CLAIM OF PRIORITY

This application claims priority from Japanese patent application 2007-197542 filed on Jul. 25, 2007.

TECHNICAL FIELD

The invention relates to a semiconductor device and a method for manufacturing thereof, and particularly, to a semiconductor device provided with a plurality of word lines and a method for manufacturing thereof.

BACKGROUND OF THE INVENTION

The manufacture and use of semiconductor devices as non-volatile memory devices (e.g., memory devices capable of retaining data even after power to the device has been turned off) have increased dramatically in response to recent developments in the technology. Flash memory is an increasingly popular type of non-volatile memory. Each memory cell of a flash memory device is typically created as a transistor provided with a floating gate or an insulating film as a so-called charge storage layer. Data is recorded by storing electric charges in a charge accumulation layer. A conventional implementation of Flash memory includes a Silicon Oxide Nitride Oxide Silicon ("SONOS") structure for storing the electric charge in a trap layer in the Oxide film/Nitride film/ Oxide film ("ONO" film) and having an insulating film as the charge storage layer.

International Application Published under the Patent Cooperation Treaty No. 2007-013155 discloses a semiconductor device having a bit line formed in the semiconductor substrate using the diffusion region, and a plurality of word lines which intersect with the bit line formed on the semiconductor substrate. In the aforementioned semiconductor device, the bit line formed in the diffusion region exhibits a high resistance. Bit line contact regions are formed at each section the bit line reaches after passing across a plurality of word lines (for example, 16 lines) for the purpose of electrically coupling between the bit line and a metal interconnection layer.

However, according to the aforementioned International Application, the proximity effect resulting from exposure of the photoresist for forming the word line increases the width of the word line adjacent to the bit line contact region to be larger than that of the other word lines. The International Application discloses a technology for providing a "dummy layer" in the bit line contact region upon formation of the word line so that the proximity effect is suppressed. However, the width of the dummy layer is larger than that of the word line, and thus fails to sufficiently suppress the proximity effect. As a result, the width of the word line adjacent to the bit line contact region becomes different from that of the other word lines. The width of a word line corresponds to the gate length of the transistor which forms the memory cell. As such, the transistor adjacent to the bit line contact region may have different properties from that of other transistors in the flash memory.

SUMMARY OF THE INVENTION

The present invention was devised in light of the foregoing problems, and to provide a flash memory with an improved distribution of word line width.

According to one embodiment of the invention, there is provided a method for manufacturing a semiconductor device including the steps of forming a bit line in a semiconductor substrate, forming a plurality of word lines which intersect with the bit line at predetermined intervals on the semiconductor substrate, eliminating a portion of the plurality of word lines, forming an interlayer insulating film on the semiconductor substrate, and forming a metal plug which penetrates through the interlayer insulating film and is coupled to the bit line in a region where the part of the plurality of word lines was eliminated.

According to another embodiment of the present invention, there is provided a semiconductor device having a bit line formed in a semiconductor substrate, a plurality of word lines which intersect with the bit line and are arranged at predetermined intervals on the semiconductor substrate, and a metal plug formed in a region where a portion of the plurality of word lines is eliminated so as to be coupled to the bit line.

According to yet another embodiment of the present invention, there is provided a semiconductor device having a bit line formed in a semiconductor substrate, a plurality of word lines formed on the semiconductor substrate and which intersect with the bit line, and a metal plug formed between two of the plurality of word lines so as to be coupled to the bit line. The device is configured according to an equation of $$L1 = N \times (Lw + Ls) + Ls$$

where L1 denotes a distance between the two of the word lines, Ls and Lw denote a distance between word lines and a width of a word line other than the two of the word lines respectively, and an N denotes a natural number.

BRIEF DESCRIPTION OF THE DRAWINGS

The accompanying drawings, which are incorporated in and form a part of this specification, illustrate embodiments of the invention and, together with the description, serve to explain the principles of the invention:

FIG. 1 depicts an exemplary layout of a flash memory, in accordance with various embodiments.

FIG. 13A depicts a top view in a fourth stage during the process of manufacturing a flash memory of FIG. 10A, in accordance with various embodiments.

FIG. 13B depicts a sectional view taken along line B-B in a fourth stage during the process of manufacturing a flash memory of FIG. 10B, in accordance with various embodiments.

FIG. 13C depicts a sectional view taken along line C-C in a fourth stage during the process of manufacturing a flash memory of FIG. 10B, in accordance with various embodiments.

FIG. 13D depicts a sectional view taken along line D-D in a fourth stage during the process of manufacturing a flash memory of FIG. 10B, in accordance with various embodiments.

FIG. 13E depicts a sectional view taken along line E-E in a fourth stage during the process of manufacturing a flash memory of FIG. 10B, in accordance with various embodiments.

FIG. 14A depicts a top view in a fifth stage during the process of manufacturing a flash memory of FIG. 10A, in accordance with various embodiments.

FIG. 14B depicts a sectional view taken along line B-B in a fifth stage during the process of manufacturing a flash memory of FIG. 10B, in accordance with various embodiments.

FIG. 14C depicts a sectional view taken along line C-C in a fifth stage during the process of manufacturing a flash memory of FIG. 10B, in accordance with various embodiments.

FIG. 14D depicts a sectional view taken along line D-D in a fifth stage during the process of manufacturing a flash memory of FIG. 10B, in accordance with various embodiments.

FIG. 14E depicts a sectional view taken along line E-E in a fifth stage during the process of manufacturing a flash memory of FIG. 10B, in accordance with various embodiments.

DETAILED DESCRIPTION

Figure 2A:
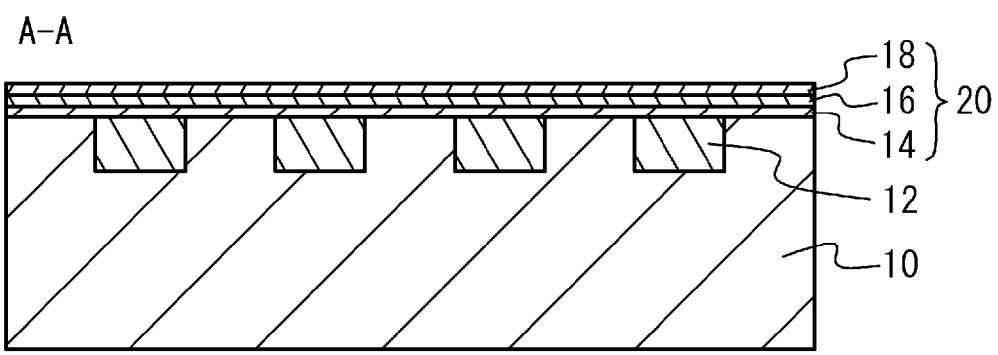
FIG. 2A depicts a sectional view taken along line A-A of a first stage during a process of manufacturing a flash memory, in accordance with various embodiments.
Figure 2B:
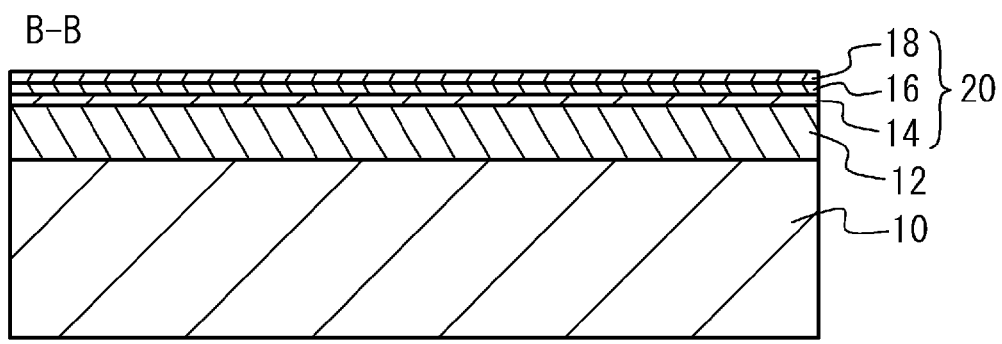
FIG. 2B depicts a sectional view taken along line B-B of a first stage during a process of manufacturing a flash memory, in accordance with various embodiments.

Reference will now be made in detail to several embodiments. While the subject matter will be described in conjunction with the alternative embodiments, it will be understood that they are not intended to limit the claimed subject matter to these embodiments. On the contrary, the claimed subject matter is intended to cover alternative, modifications, and equivalents, which may be included within the spirit and scope of the claimed subject matter as defined by the appended claims.

Furthermore, in the following detailed description, numerous specific details are set forth in order to provide a thorough understanding of the claimed subject matter. However, it will be recognized by one skilled in the art that embodiments may be practiced without these specific details or with equivalents thereof. In other instances, well-known methods, procedures, and components, have not been described in detail as not to unnecessarily obscure aspects and features of the subject matter.

Portions of the detailed description that follows are presented and discussed in terms of a method. Although steps and sequencing thereof are disclosed in a figure herein (e.g., FIG. 5) describing the operations of this method, such steps and sequencing are exemplary. Embodiments are well suited to performing various other steps or variations of the steps recited in the flowchart of the figure herein, and in a sequence other than that depicted and described herein.

First Embodiment

Referring now to FIG. 1, FIG. 1 depicts an exemplary layout of a flash memory, in accordance with a one embodiment. As presented in FIG. 1, bit lines 12 are formed in a semiconductor substrate 10. A plurality of word lines 22 which intersect with the bit lines 12 are formed on the semiconductor substrate 10. A bit line contact region 40 is formed at a section where the bit line 12 reaches after passing across a certain number of the word lines. In the bit line contact region 40, metal plugs 28 are disposed so as to be coupled to the bit lines 12, respectively. The metal plug 28 is coupled to an interconnection layer (not shown) which extends along the direction in which the bit line 12 extends.

The word lines 22 in the area other than the bit line contact region 40 are arranged at predetermined intervals. A distance L1 between adjacent word lines 22 having the bit line contact region 40 there between is the same as a distance L2 between the word lines 22 interposing another word line 22 there between in the area other than the bit line contact region 40. The bit line contact region 40 corresponds to an area where one of the plurality of word lines is eliminated.

Note that the bit line contact region 40 may be the area where a portion of the plurality of word lines 22 arranged at predetermined intervals is eliminated. In other words, the distance L1 may satisfy the following equation:

$$L1 = N \times (Lw + Ls) + Ls \quad (N: \text{natural number})$$

where the Lw and the Ls denote the width of the word line 22 and the distance between the adjacent word lines 22 in the area other than the bit line contact region 40 respectively.

Referring to FIGS. 2A to 7B, the method for manufacturing the flash memory according to the first embodiment will be described. Referring to FIGS. 2A and 2B, a tunnel oxide film 14 as a silicon oxide film, a trap layer 16 as a silicon nitride film, and a top oxide film 18 as the silicon oxide film are sequentially formed on the p-type semiconductor silicon substrate 10 (or the p-type region in the semiconductor substrate). As a result, an ONO film 20 is formed on the semiconductor substrate 10 as the charge storage layer. The arsenic ion implantation is performed into the semiconductor substrate 10 to form the bit lines 12 each formed of the n-type diffusion area. FIG. 2A is a sectional view of the bit line 12 in the lateral direction. FIG. 2B is a sectional view of the bit line 12 in the direction in which it extends.

Figure 3A:
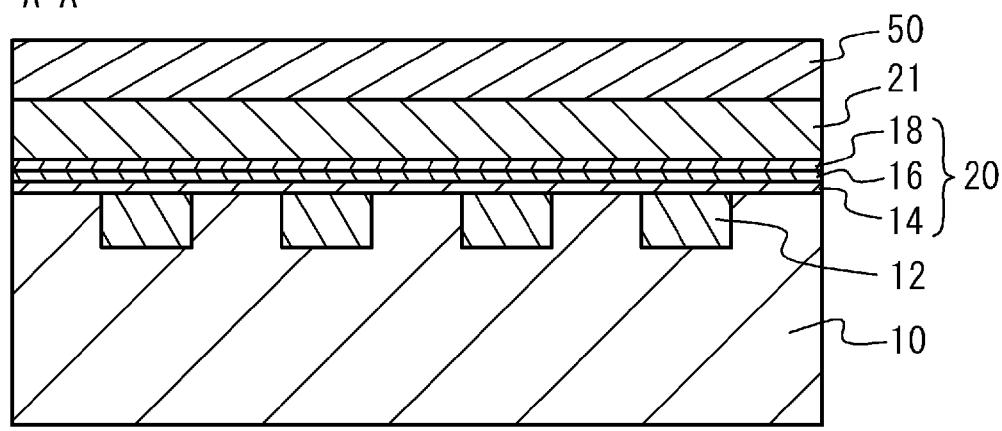
FIG. 3A depicts a sectional view taken along line A-A in a second stage during the process of manufacturing a flash memory of FIG. 2A, in accordance with various embodiments.
Figure 3B:
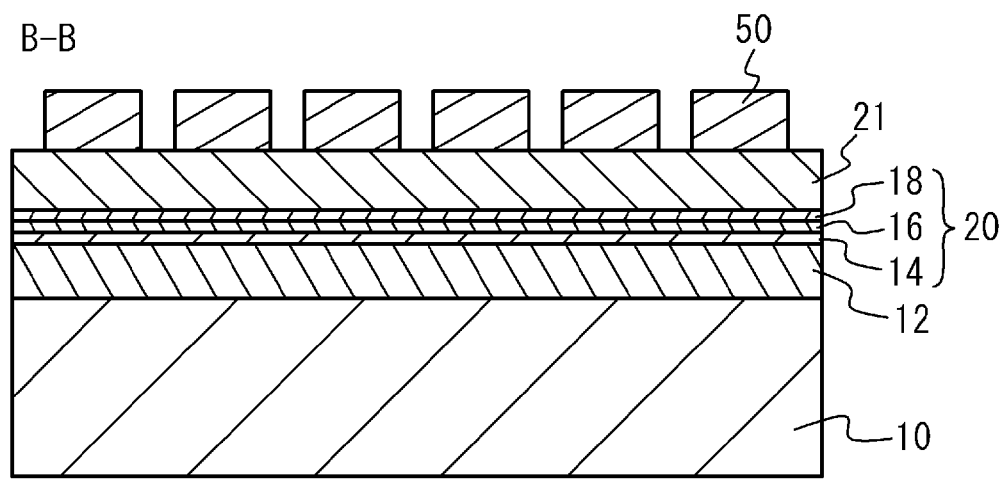
FIG. 3B depicts a sectional view taken along line B-B in a second stage during the process of manufacturing a flash memory of FIG. 2B, in accordance with various embodiments.

Referring here to FIGS. 3A and 3B, a conductive layer 21 formed of polysilicon, which is to be the word lines, is applied onto the semiconductor substrate 10 via the ONO film 20 through the Chemical Vapor Deposition ("CVD") process, for example. A photoresist 50 is then applied onto the conductive layer 21. The photoresist 50 is formed with the stripe patterns at predetermined intervals through the exposure technology.

Figure 4A:
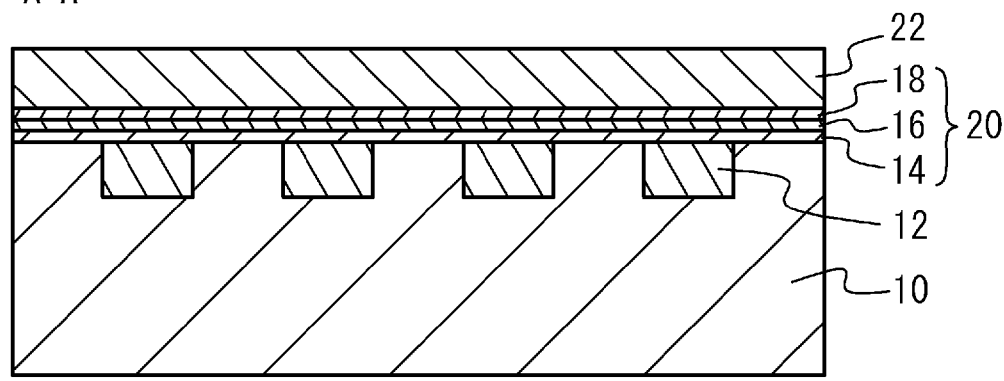
FIG. 4A depicts a sectional view taken along line A-A in a third stage during the process of manufacturing a flash memory of FIG. 2A, in accordance with various embodiments.
Figure 4B:
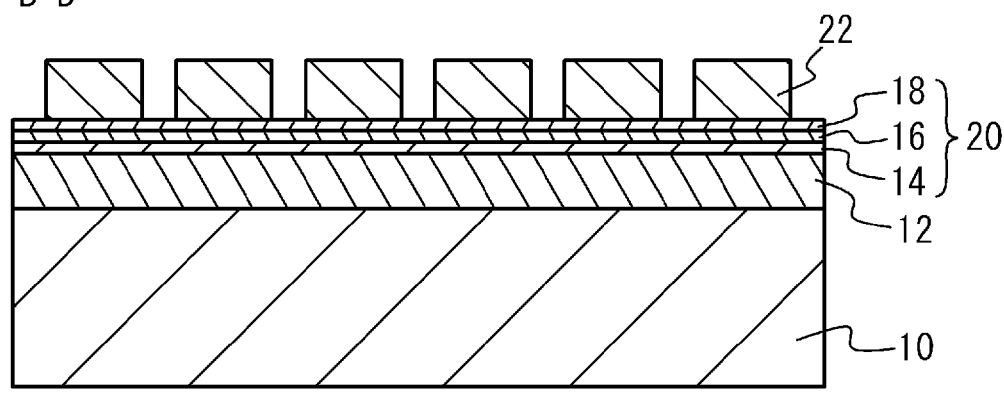
FIG. 4B depicts a sectional view taken along line B-B in a third stage during the process of manufacturing a flash memory of FIG. 2B, in accordance with various embodiments.

Referring now to FIGS. 4A and 4B, the conductive layer 21 is etched using the photoresist 50 with the patterns as the mask such that a plurality of word lines 22 intersecting with the bit lines 12 are formed at predetermined intervals.

Figure 5:
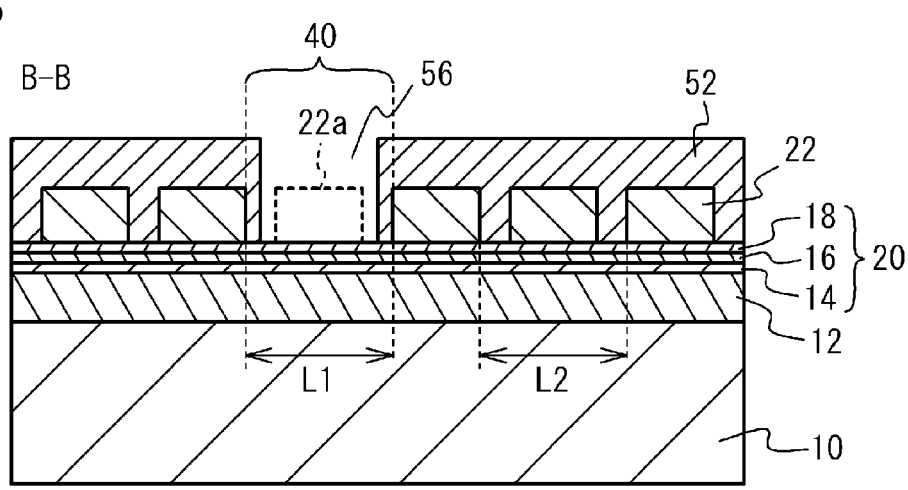
FIG. 5 depicts a sectional view taken along line B-B in a fourth stage during the process of manufacturing a flash memory of FIG. 2B, in accordance with various embodiments.

Referring to FIG. 5, a photoresist 52 is applied onto the semiconductor substrate 10 so as to cover the word lines 22. An opening 56 is formed through the exposure technology so as to expose a word line 22a (indicated by the broken line in FIG. 5) among the plurality of word lines 22. The exposed word line 22a is etched to be eliminated. The area corresponding to the eliminated word line 22a becomes the bit line contact region 40. Accordingly, the distance L1 becomes equal to the distance L2.

Figure 6:
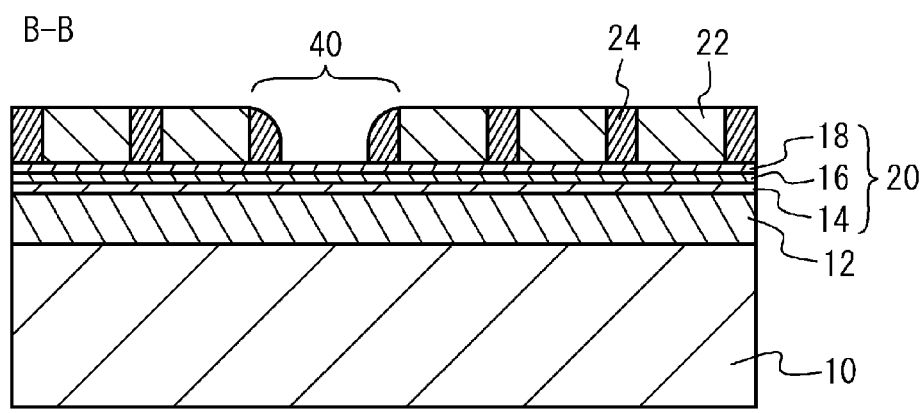
FIG. 6 depicts a sectional view taken along line A-A in a fifth stage during the process of manufacturing a flash memory of FIG. 2A, in accordance with various embodiments.

Referring to FIG. 6, a second insulating layer 24 is formed of the silicon nitride so as to cover the word lines 22. Performing the etch back forms a side wall as the second insulating layer 24 formed at the side of the word line 22. In the area other than the bit line contact region 40, the interval between the word lines 22 is so small that the second insulating layer 24 at the side of the adjacent word line 22 is integrated therewith. Meanwhile, in the bit line contact region 40, the interval between the word lines 22 is large, thus forming an area where the second insulating film 24 is not formed.

Figure 7A:
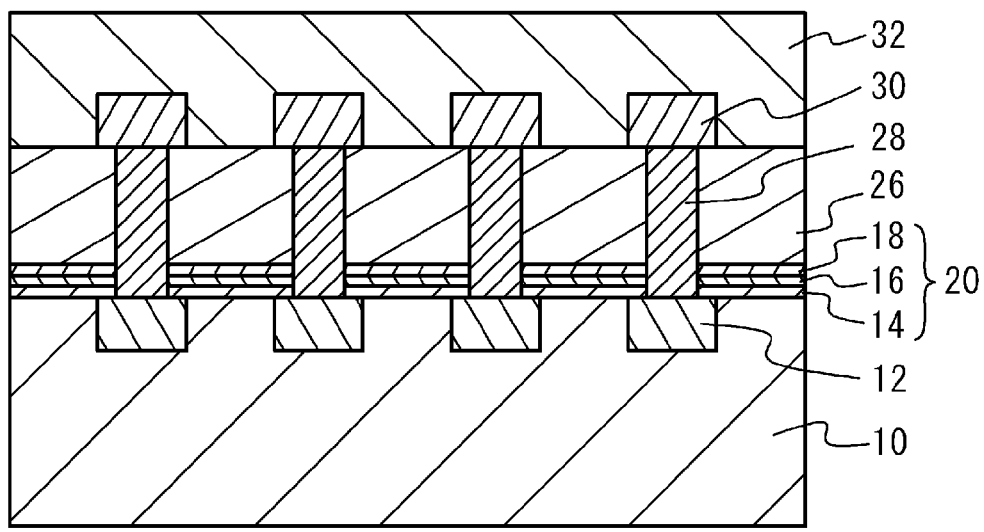
FIG. 7A depicts a sectional view taken along line A-A in a sixth stage during the process of manufacturing a flash memory of FIG. 2A, in accordance with various embodiments.
Figure 7B:
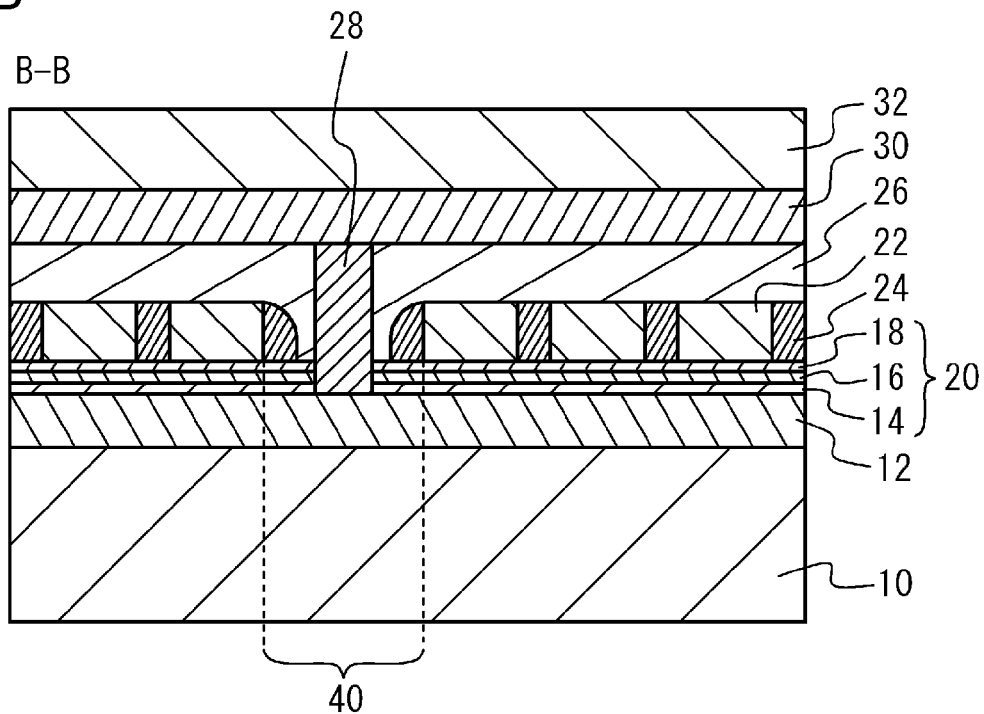
FIG. 7B depicts a sectional view taken along line B-B in a sixth stage during the process of manufacturing a flash memory of FIG. 2B, in accordance with various embodiments.

Referring to FIGS. 7A and 7B, an interlayer insulating film 26 formed of the silicon oxide film, for example, is applied onto the semiconductor substrate 10 via the ONO film 20, the word lines 22, and the second insulating layers 24. In the bit line contact region 40, a contact hole coupled to the bit line 12 is formed in the interlayer insulating film 26. Metal plug 28 is formed in the contact hole using a metal such as tungsten. An interconnection layer 30 coupled to the metal plug 28 is formed on the interlayer insulating film 26. The interconnection layer 30 is formed of the metal, and extends along the direction in which the bit line extends. A protection film 32 is formed so as to cover the interconnection layer 30. In this manner, the flash memory according to the first embodiment is completed.

According to the first embodiment, the photoresist 50 (mask layer) with the patterns at predetermined intervals are formed on the conductive layer 21 as shown in FIG. 3B. This makes it possible to suppress the proximity effect upon the exposure, and to allow each width of the respective patterns to be substantially the same. Accordingly, the conductive layer 21 is eliminated using the photoresist 50 as the mask such that the plurality of word lines 22 are formed at predetermined intervals as shown in FIG. 4B. Thereafter, the word line 22a as a portion of the plurality of word lines 22 is eliminated to form the bit line contact region 40 as shown in FIG. 5. As described above, the word line 22 adjacent to the bit line contact region 40 may be formed to have substantially the same width as that of the other word line 22. This makes it possible to suppress the distribution of the property of the transistor which forms the memory cell. Note that while FIG. 5 shows that the single word line 22a is eliminated, in alternate embodiments two or more word lines may be eliminated.

Second Embodiment

Figure 8:
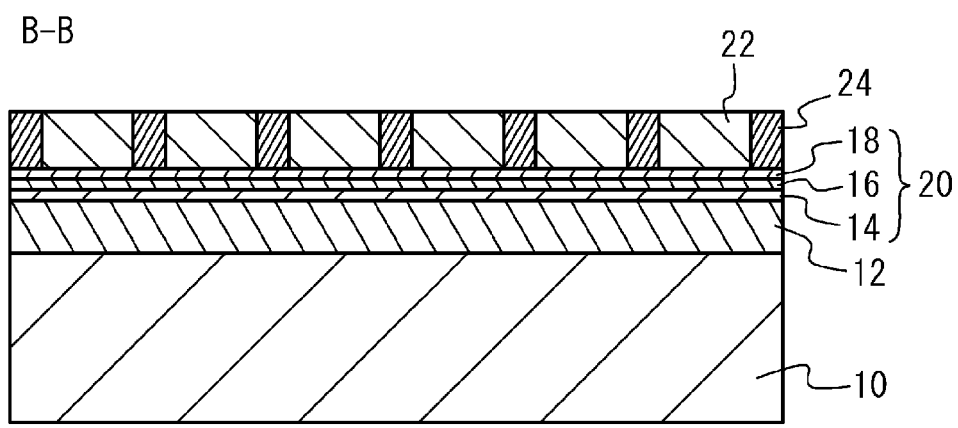
FIG. 8 depicts a sectional view taken along line B-B in a first stage during an alternate process of manufacturing a flash memory, in accordance with various embodiments.

In a second embodiment, second insulating layers are formed among the plurality of word lines, and the part of the word lines is eliminated after the formation of the second insulating layers. Referring thus to FIG. 8, the second insulating layers 24 each formed of the silicon nitride are formed so as to cover the word lines 22 after the forming step thereof, as shown in FIGS. 4A and 4B. The upper surface of the word line 22 is exposed through the etch back, and each space between the word lines 22 is filled with the second insulating layer 24.

Figure 9:
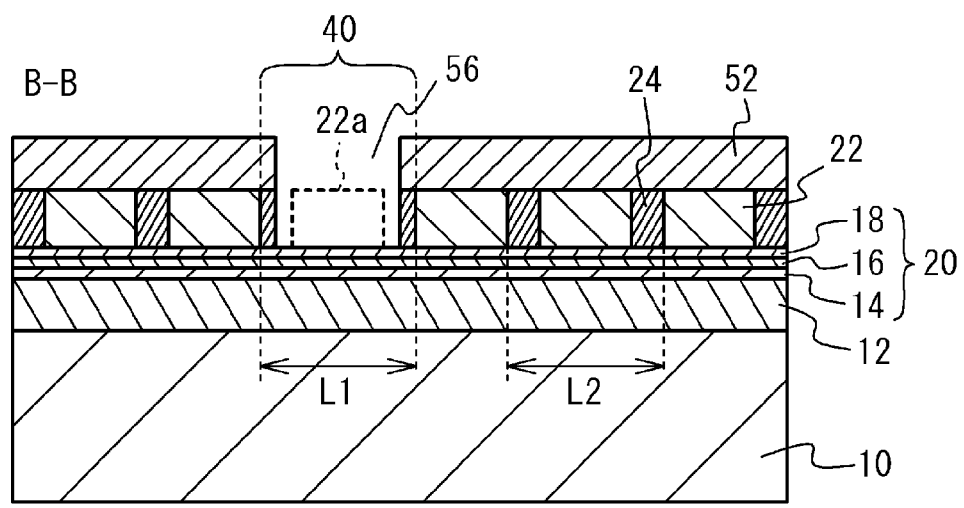
FIG. 9 depicts a sectional view taken along line B-B in a second stage during the process of manufacturing a flash memory of FIG. 8, in accordance with various embodiments.

Referring to FIG. 9, a photoresist 52 is applied onto the semiconductor substrate 10 so as to cover the word lines 22. The opening 56 is formed so as to expose one word line 22a (shown by the broken line in FIG. 9) among the plurality of word lines 22 through conventional exposure technology. The exposed word line 22a and the second insulating layers 24 in the vicinity thereof are etched to be eliminated. The area corresponding to the eliminated word line 22a and the second insulating layers 24 becomes the bit line contact region. This allows the distances L1 and L2 to be equal. Thereafter, the step of the first embodiment as shown in FIGS. 7A and 7B is performed to complete production of the flash memory according to the second embodiment.

In the first embodiment herein described, upon formation of the second insulating layer 24 shown in FIG. 6, each of the second insulating layers 24 in the bit line contact region 40 has a different cross sectional shape from that of the second insulating layer 24 between the word lines 22 in the area other than the bit line contact region 40. Accordingly, the stress from the second insulating layer 24 exerted to the word line 22 adjacent to the bit line contact region 40 is different from the one exerted to the other word line 22. Consequently, the transistor adjacent to the bit line contact region 40 has the different property from that of the other transistor. In the second embodiment, upon formation of the second insulating layer 24 as shown in FIG. 8, each cross section of all the second insulating layers 24 has substantially the same shape. Consequently, the stress exerted to the word line 22 becomes uniform, resulting in a greater uniformity amongst the transistors.

Third Embodiment

Figure 10A:
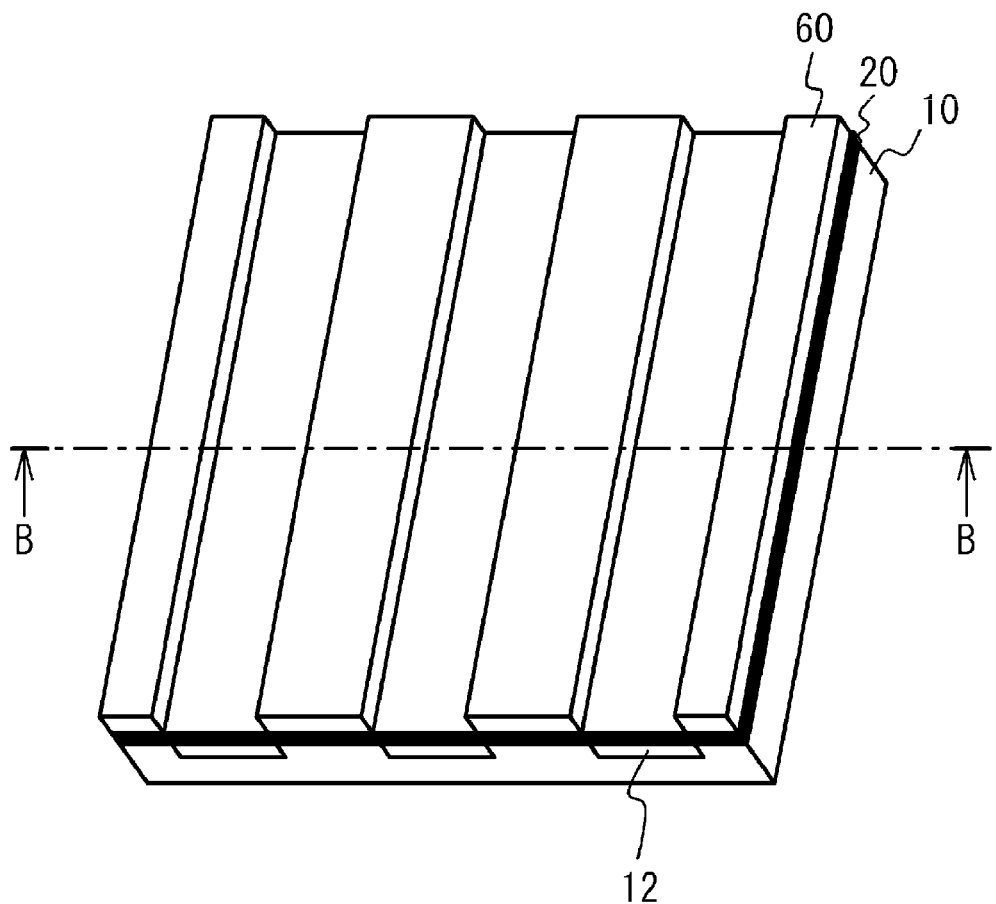
FIG. 10A depicts a top view in a first stage during another process of manufacturing a flash memory in accordance with various embodiments.
Figure 10B:
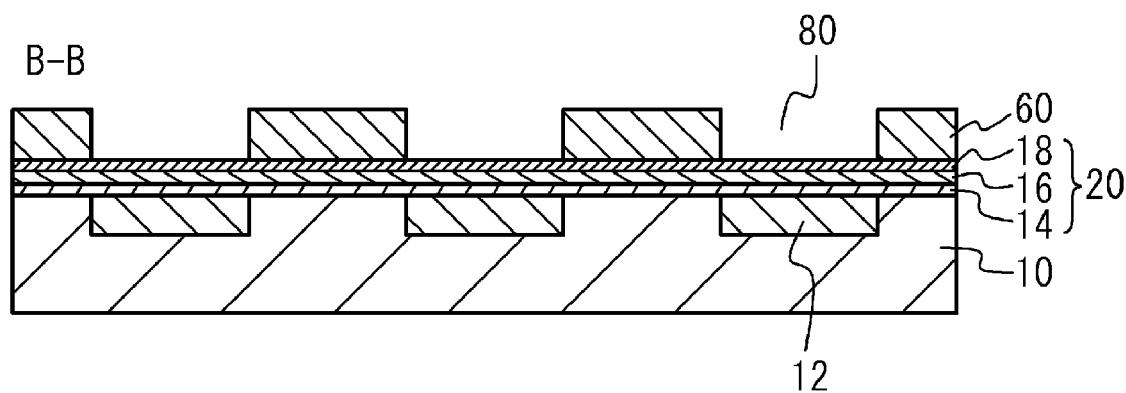
FIG. 10B depicts a sectional view taken along line B-B in a first stage during another process of manufacturing a flash memory in accordance with various embodiments.

In a third embodiment, the word line is formed of first and second conductive layers. The method for manufacturing a flash memory according to the third embodiment will be described referring to FIGS. 10A to 14B. Referring first to FIGS. 10A and 10B, the ONO film 20 formed of the tunnel oxide film 14, the trap layer 16 and the top oxide film 18 is applied onto the semiconductor substrate 10. A first conductive layer 60 formed of polysilicon is applied onto the semiconductor substrate 10 via the ONO film 20. Each area of the first conductive layers 60 where the bit line is to be formed is eliminated to form an opening 80 such that the resultant first conductive layers 60 are arranged in the stripe state. The arsenic ion implantation is performed into the semiconductor substrate 10 using the first conductive layer 60 as the mask. Consequently, the bit lines 12 are formed in the semiconductor device 10.

Figure 11A:
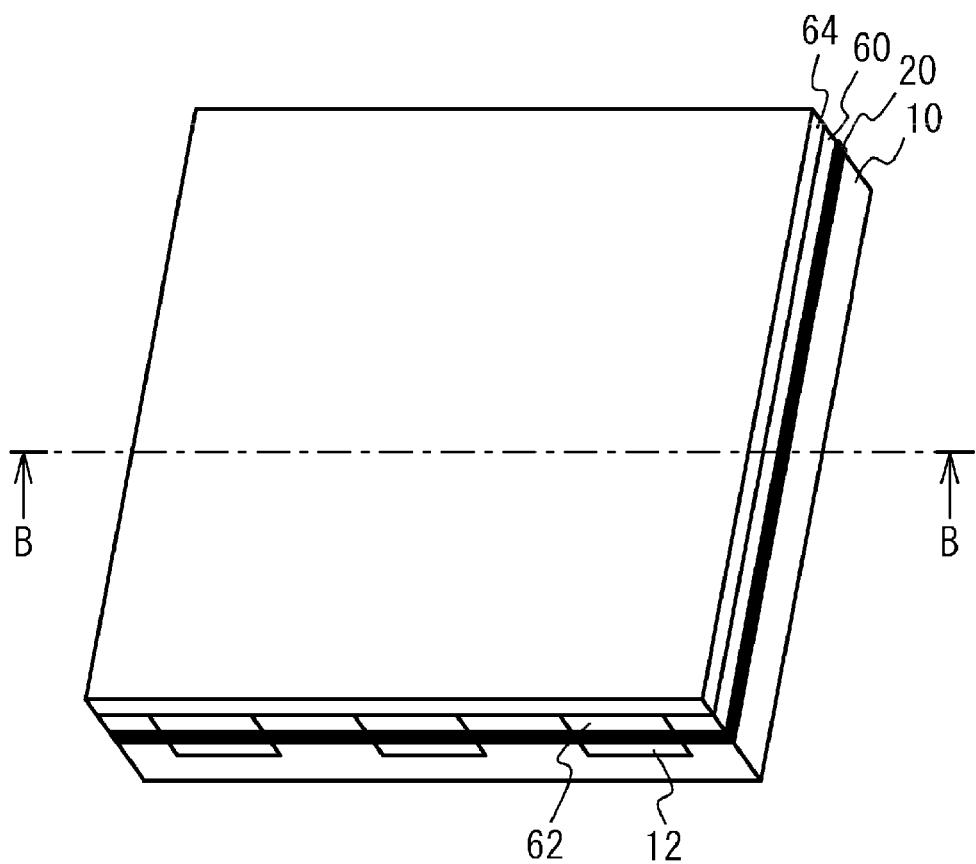
FIG. 11A depicts a top view in a second stage during the process of manufacturing a flash memory of FIG. 10A, in accordance with various embodiments.
Figure 11B:
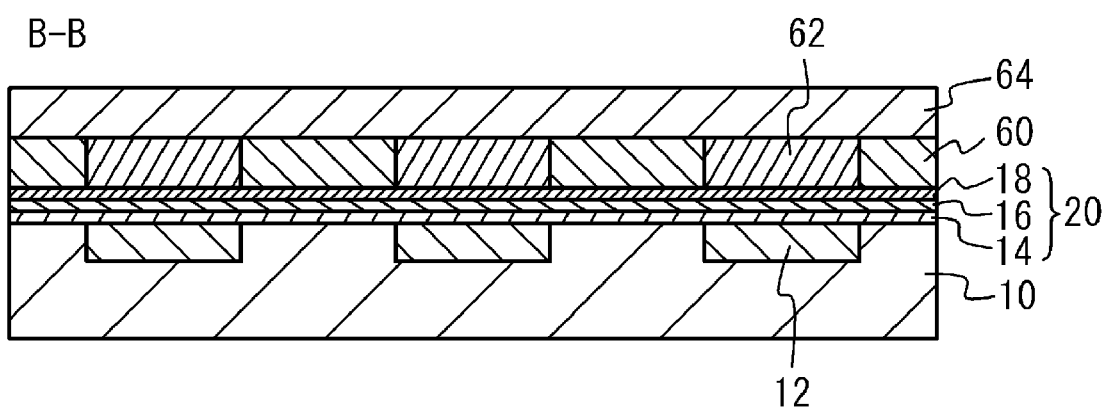
FIG. 11B depicts a sectional view taken along line B-B in a second stage during the process of manufacturing a flash memory of FIG. 10B, in accordance with various embodiments.

Referring next to FIGS. 11A and 11B, first insulating layers 62 each formed of the silicon oxide film are formed so as to cover the first conductive layer 60. The first insulating layer 62 is polished through a Chemical Mechanical Polish (CMP) process so as to be formed on the bit line 12 between the first conductive layers 60. The bit line 12 and the first insulating layer 62 are formed in a self alignment manner. A second conductive layer 64 formed of polysilicon is applied onto the first conductive layers 60 and the first insulating layers 62.

Figure 12E:
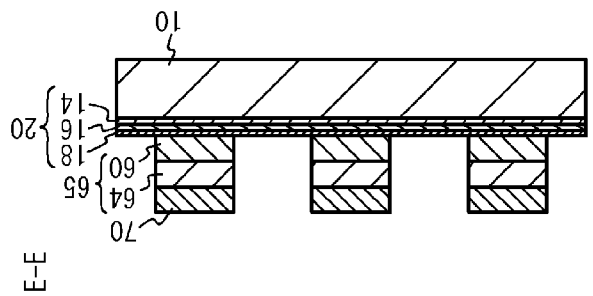
FIG. 12E depicts a sectional view taken along line E-E in a third stage during the process of manufacturing a flash memory of FIG. 10B, in accordance with various embodiments.
Figure 12D:
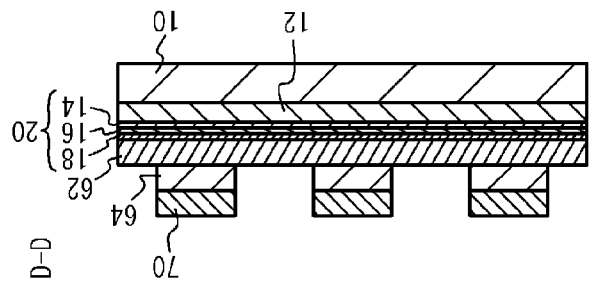
FIG. 12D depicts a sectional view taken along line D-D in a third stage during the process of manufacturing a flash memory of FIG. 10B, in accordance with various embodiments.
Figure 12A:
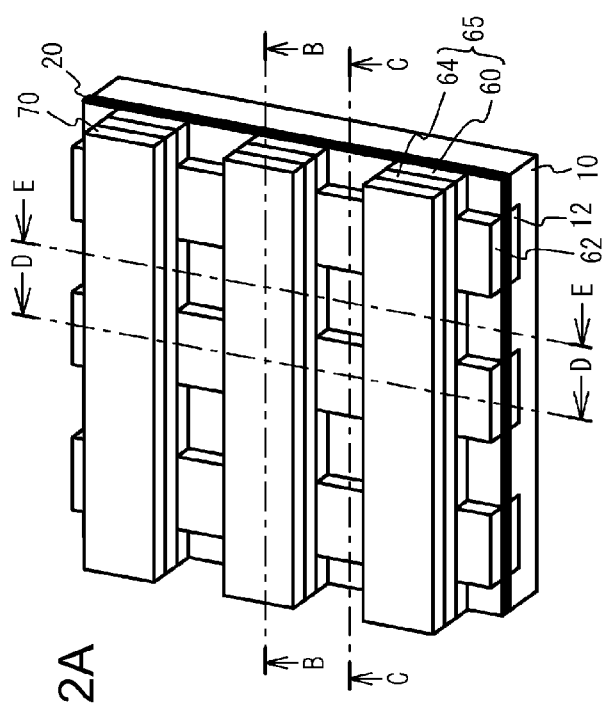
FIG. 12A depicts a top view in a third stage during the process of manufacturing a flash memory of FIG. 10A, in accordance with various embodiments.
Figure 12B:
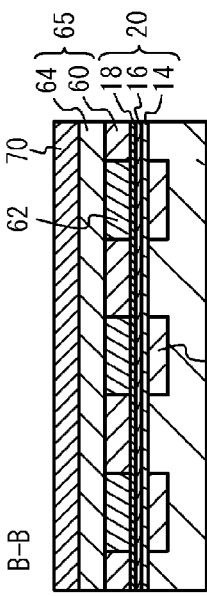
FIG. 12B depicts a sectional view taken along line B-B in a third stage during the process of manufacturing a flash memory of FIG. 10B, in accordance with various embodiments.

Referring to now FIGS. 12A to 12E, a photoresist 70 (mask layer) with patterns at predetermined intervals is formed on the second conductive layers 64. The second conductive layer 64 and the first conductive layer 60 are etched to be eliminated using the photoresist 70 as the mask. The plurality of word lines 65 are formed from the first and the second conductive layers 60 and 64 so as intersect with the bit lines 12. Referring to FIG. 12B, in the area where the word line 65 is formed, the first insulating layer 62 and the second conductive layer 64 are formed on the bit line 12, and the first conductive layer 60 and the second conductive layer 64 are formed between the bit lines 12. The first conductive layer 60, formed directly on the ONO film 20, serves as a gate electrode between the bit lines 12.

Figure 12C:
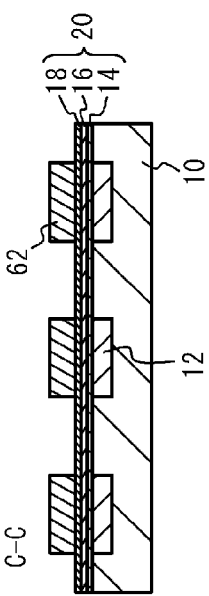
FIG. 12C depicts a sectional view taken along line C-C in a third stage during the process of manufacturing a flash memory of FIG. 10B, in accordance with various embodiments.

Referring to FIG. 12C, the first insulating layer 62 is left on the bit line 12 between the word lines 65. Meanwhile, the first and the second conductive layers 60 and 64 are eliminated. Referring to FIG. 12D, in the region where the bit line 12 is formed, the first insulating layer 62 extends along the direction in which the bit line 12 extends. Referring to FIG. 12E, the first insulating layer 62 is not formed between the bit lines 12.

Referring to FIGS. 13A to 13E, a portion of the plurality of word lines 65 is eliminated. Consequently, the bit line contact region 40 is formed.

Referring to FIGS. 14A to 14E, second insulating layers 68, each formed of the silicon nitride, are formed through the high density plasma CVD process so as to cover the word lines 65 and the first insulating layers 62. The second insulating layers 68 are then etched back. Therefore, side walls each formed as the second insulating layer 68 are formed at the bit line contact region 40 side of the word line 65 adjacent to the bit line contact region 40. Meanwhile, the area between the word lines 65 other than the bit line contact region 40 is filled with the second insulating layer 68.

Figure 15A:
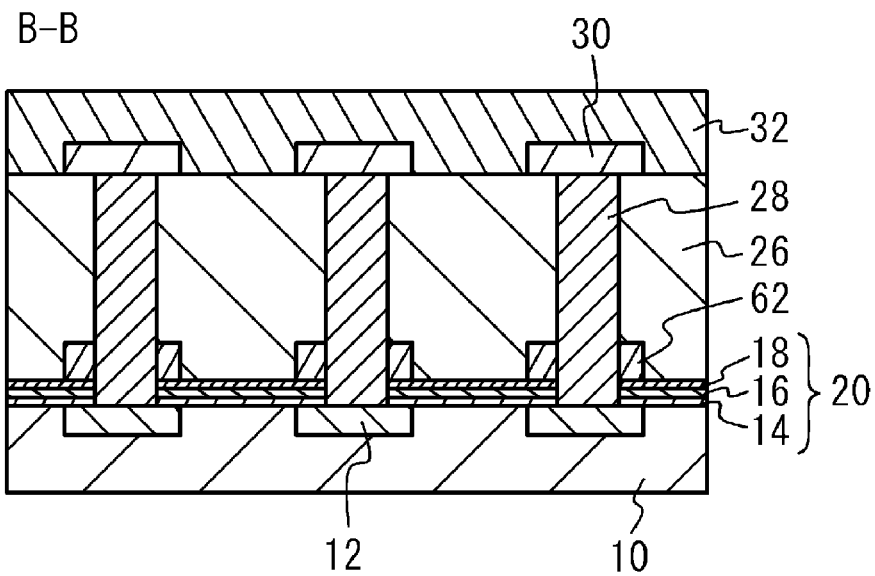
FIG. 15A depicts a sectional view taken along line B-B in a sixth stage during the process of manufacturing a flash memory of FIG. 10B, in accordance with various embodiments.
Figure 15B:
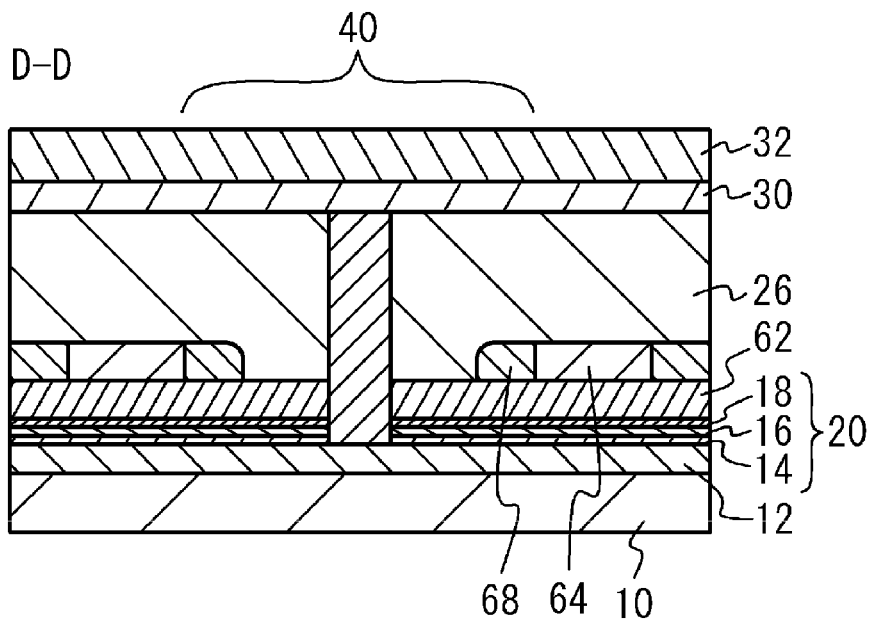
FIG. 15B depicts a sectional view taken along line D-D in a sixth stage during the process of manufacturing a flash memory of FIG. 10B, in accordance with various embodiments.
Figure 16E:
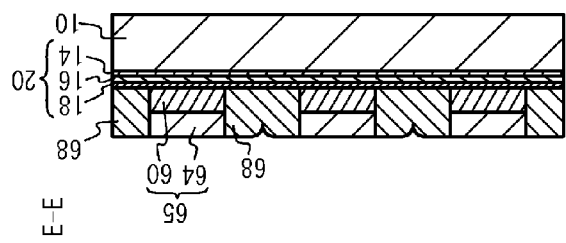
FIG. 16E depicts a sectional view taken along line E-E in a first stage during the process of manufacturing a flash memory of FIG. 16B, in accordance with various embodiments.
Figure 16D:
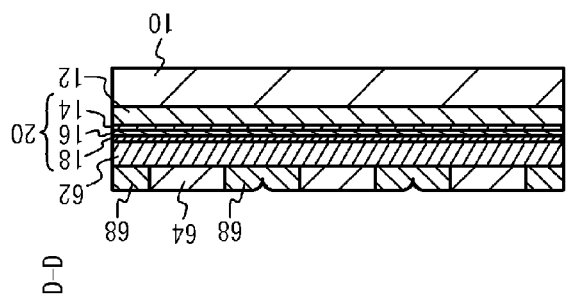
FIG. 16D depicts a sectional view taken along line D-D in a first stage during the process of manufacturing a flash memory of FIG. 16B, in accordance with various embodiments.
Figure 16A:
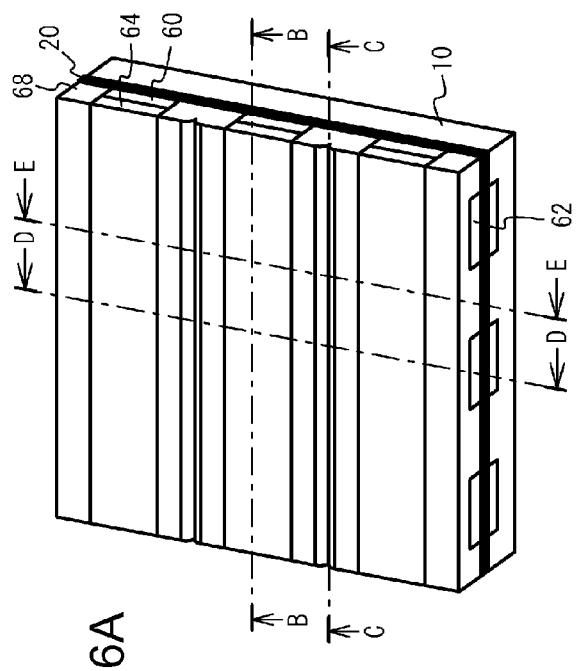
FIG. 16A depicts a top view in a first stage during yet another process of manufacturing a flash memory, in accordance with various embodiments.
Figure 16B:
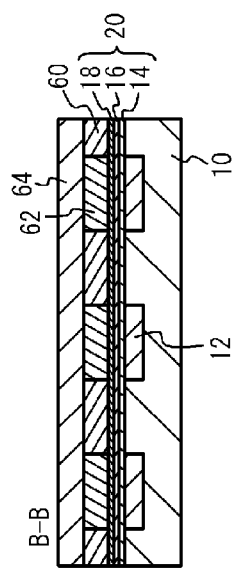
FIG. 16B depicts a sectional view taken along line B-B in a first stage during yet another process of manufacturing a flash memory, in accordance with various embodiments.
Figure 16C:
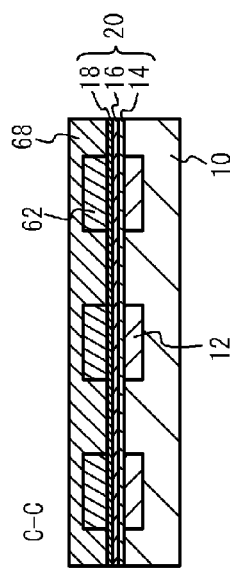
FIG. 16C depicts a sectional view taken along line C-C in a first stage during the process of manufacturing a flash memory of FIG. 16B, in accordance with various embodiments.
Figure 17E:
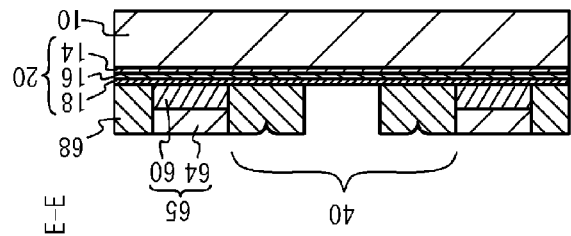
FIG. 17E depicts a sectional view taken along line E-E in a second stage during the process of manufacturing a flash memory of FIG. 16B, in accordance with various embodiments.
Figure 17D:
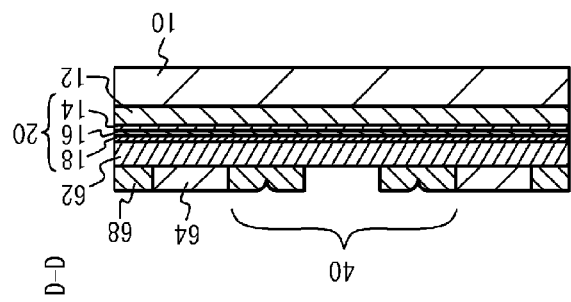
FIG. 17D depicts a sectional view taken along line D-D in a second stage during the process of manufacturing a flash memory of FIG. 16B, in accordance with various embodiments.
Figure 17A:
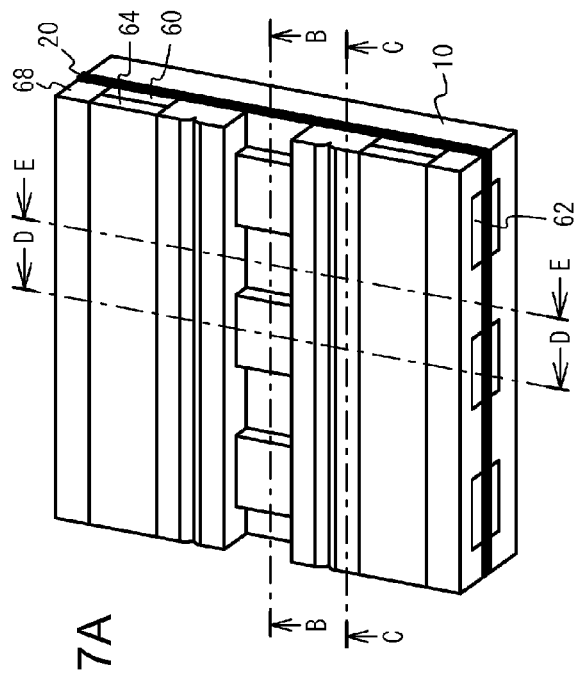
FIG. 17A depicts a top view in a second stage during the process of manufacturing a flash memory of FIG. 16A, in accordance with various embodiments.
Figure 17B:
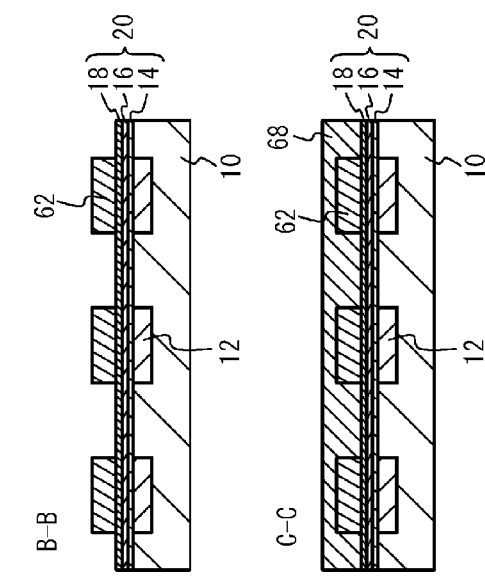
FIG. 17B depicts a sectional view taken along line B-B in a second stage during the process of manufacturing a flash memory of FIG. 16B, in accordance with various embodiments.
Figure 17C:
FIG. 17C depicts a sectional view taken along line C-C in a second stage during the process of manufacturing a flash memory of FIG. 16B, in accordance with various embodiments.

Referring to FIGS. 15A and 15B, the interlayer insulating films 26 each formed of the silicon oxide film are applied so as to cover the word line 65, the first insulating layers 62 and the second insulating layers 68. The metal plug 28 coupled to the bit line 12 while penetrating through the interlayer insulating film 26 is formed in the bit line contact region 40. The interconnection layer 30 coupled to the metal plug 28 is applied onto the interlayer insulating films 26. The protection film 32 is further formed to cover the interconnection layer 30, thus completing production of the flash memory according to the third embodiment.

In the third embodiment, the photoresist 70 (mask layer) with the patterns at predetermined intervals is formed on the second conductive layer 64 as shown in FIGS. 12A to 12E. This makes it possible to suppress the proximity effect upon the exposure, thus making the width of each of the patterns substantially the same. Accordingly, the plurality of word lines 65 may be formed at uniform intervals upon the formation thereof by eliminating the second and the first conductive layers 64 and 60 using the photoresist 70 as the mask. Thereafter, the bit line contact region 40 may be formed by eliminating a portion of the plurality of word lines 65 as shown in FIGS. 13A to 13E. In the case where the word line 65 is formed of the first and the second conductive layers 60 and 64, the word line 65 adjacent to the bit line contact region 40 may have substantially the same width as that of the other word line 65.

Fourth Embodiment

In a fourth embodiment, the second insulating layers are formed among the plurality of word lines, and a portion of the word lines is eliminated after forming the second insulating layers. Referring first to FIGS. 16A to 16E, the second insulating layers 68 each formed of the silicon nitride film are formed through the high density plasma CVD process so as to cover the word lines 65 and the first insulating layers 62 after performing the step according to the second embodiment shown in FIGS. 12A to 12E. The second insulating layers 68 are etched back to expose the upper surfaces of the word lines 65. Accordingly, the second insulating layer 68 may be filled between the word lines 65.

Referring next to FIGS. 17A to 17E, a portion of the plurality of word lines 65 is eliminated. Consequently, the bit line contact region 40 is formed. Thereafter, the step according to the third embodiment shown in FIGS. 15A and 15B is performed to complete production of the flash memory according to the fourth embodiment.

As described in the third embodiment, the second insulating layer 68 in the bit line contact region 40 in the forming step thereof as shown in FIGS. 14A to 14E has a different cross sectional shape than that of the second insulating layer 68 between the word lines 65 in the area other than the bit line contact region 40. Likewise, as described in the first embodiment, the stress from the second insulating layer 68 exerted on the word line 65 adjacent to the bit line contact region 40 is different from the one exerted on the other word line 65. However, in the fourth embodiment as shown in FIG. 16A to 16E, every cross sectional shape of the second insulating layers 68 becomes substantially the same in the forming step thereof. Therefore, the uniform stress is exerted on the word line 65, resulting in a more uniform transistor property.

In the above described embodiments, a case where an ONO film 20 is implemented as the charge storage layer formed on the semiconductor substrate 10, and the word lines 22 or 65 are formed on the ONO film 20 has been described. However, formation of the charge storage layer is not limited to such. For example, the charge storage layer may also be formed at the side of the word line 22.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. A method for manufacturing a semiconductor device comprising:
   forming a bit line in a semiconductor substrate;
   forming a plurality of word lines, the plurality of word lines intersecting with the bit line at predetermined intervals on the semiconductor substrate;
   eliminating a portion of the plurality of word lines comprising a region;
   forming an interlayer insulating film on the semiconductor substrate; and
   forming a metal plug, wherein the metal plug penetrates through the interlayer insulating film and is coupled to the bit line in the region where the portion of the plurality of word lines was eliminated.

2. The method for manufacturing a semiconductor device according to claim 1, further comprising:
   forming a conductive layer on the semiconductor substrate; and
   forming a mask layer with a pattern at predetermined intervals on the conductive layer, wherein forming the plurality of word lines comprises forming the plurality of word lines by eliminating the conductive layer using the mask layer as a mask.

3. The method for manufacturing a semiconductor device according to claim 1, further comprising:
   forming a first conductive layer on the semiconductor substrate;
   forming a second conductive layer on the first conductive layer; and
   forming a mask layer, the mask layer comprising a pattern at predetermined intervals on the second conductive layer, wherein forming the plurality of word lines includes forming the plurality of word lines by eliminating the first conductive layer and the second conductive layer using the mask layer as a mask.

4. The method for manufacturing a semiconductor device according to claim 3, further comprising eliminating an area of the first conductive layer where the bit line is to be formed, wherein forming the bit line includes forming the bit line by using the first conductive layer as a mask.

5. The method for manufacturing a semiconductor device according to claim 4, further comprising forming a first insulating layer on the bit line between the first conductive layers, wherein forming the second conductive layer includes forming the second conductive layer on the first conductive layer and the first insulating layer.

6. The method for manufacturing a semiconductor device according to claim 1, further comprising forming second insulating layers among the plurality of word lines, wherein eliminating the portion of the word lines is performed after forming the second insulating layers.

7. The method for manufacturing a semiconductor device according to claim 1, further comprising forming a charge storage layer on the semiconductor substrate, wherein forming the word lines includes forming the word lines on the charge storage layer.

* * * * *